United States Patent
Liu et al.

(10) Patent No.: US 8,816,483 B1
(45) Date of Patent: Aug. 26, 2014

(54) SEMICONDUCTOR CHIP PACKAGE STRUCTURE

(71) Applicant: Chunghwa Picture Tubes, Ltd., Taoyuan (TW)

(72) Inventors: Chi-Chao Liu, Yunlin County (TW); Chih-Jui Wang, Taichung (TW); Long-Chi Chen, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 14/259,166

(22) Filed: Apr. 23, 2014

Related U.S. Application Data

(62) Division of application No. 13/645,482, filed on Oct. 4, 2012, now Pat. No. 8,748,226.

(30) Foreign Application Priority Data

Apr. 19, 2012 (TW) .............................. 101113975 A

(51) Int. Cl.
*H01L 23/495* (2006.01)

(52) U.S. Cl.
USPC ........... 257/676; 257/678; 257/686; 257/690; 257/E23.033

(58) Field of Classification Search
USPC ......... 257/676–678, 686–690, 728, 753, 783; 438/106–107, 113, 118–119
See application file for complete search history.

(56) References Cited

U.S. PATENT DOCUMENTS

| | | | |
|---|---|---|---|
| 6,538,306 B1 * | 3/2003 | Inada et al. | 257/666 |
| 2008/0136004 A1 | 6/2008 | Yang et al. | |
| 2009/0029504 A1 | 1/2009 | Paik et al. | |
| 2011/0003431 A1 | 1/2011 | Huang | |

FOREIGN PATENT DOCUMENTS

| | | |
|---|---|---|
| TW | 200528531 A | 9/2005 |
| TW | I287265 | 9/2007 |
| TW | 200843583 A | 11/2008 |

* cited by examiner

*Primary Examiner* — Dung A. Le
(74) *Attorney, Agent, or Firm* — CKC & Partners Co., Ltd.

(57) ABSTRACT

A method for fixing a semiconductor chip on a circuit board is provided, which includes following steps. The circuit board is provided, which sequentially includes a substrate having a chip connecting portion, at least one metal wire and an insulating layer. An organic insulating material is formed on the insulating layer of the outside edge of the chip connecting portion. An anisotropic conductive film (ACF) is then formed to cover the chip connecting portion and a portion of the organic insulating material. Finally, a semiconductor chip is hot-pressed on the ACF. The organic insulating material formed on the insulating layer is used to prevent the metal wires beneath the insulating layer from occurring of corrosion. A semiconductor chip package structure is also provided.

4 Claims, 7 Drawing Sheets

SEMICONDUCTOR CHIP PACKAGE STRUCTURE

RELATED APPLICATIONS

The present application is a Divisional Application of the application Ser. No. 13/645,482, filed Oct. 4, 2012, the entire contents of which are hereby incorporated herein by reference, which claims priority to Taiwanese Application Serial Number 101113975, filed Apr. 19, 2012, all of which are herein incorporated by reference.

BACKGROUND

1. Technical Field

The present invention relates to a method for fixing a semiconductor chip on a circuit board and the structure thereof. More particularly, the present invention relates to method for fixing a semiconductor chip on a circuit board and the structure thereof for liquid crystal display devices.

2. Description of Related Art

In recent years, the development of electronic products is moving toward high packaging density and high electrical reliability. As such, techniques like chip on film (COF) and chip on glass (COG) have been developed, in which the COG technique has been applied in liquid crystal display devices.

A COG process is described as follows. Firstly, an anisotropic conductive film (ACF) is covered on contact pads and an insulating layer surrounding those pads. A semiconductor chip is then hot-pressed on the ACF to make bumps of the semiconductor chip respectively electrically connected the contact pads through the ACF. However, at the reliability test of a panel under high temperature and high humidity, the metal wires beneath the insulating layer are randomly corroded and broken, such that the panel may be scrapped.

Accordingly, there is still a need for a method for fixing a semiconductor chip on a circuit board and the structure thereof, in order to solve the problems described above.

SUMMARY

An objective of the present invention is to provide a method for fixing a semiconductor chip on a circuit board to prevent metal wires from corrosion during a reliability test under high temperature and high humidity.

According to one embodiment of the present invention, the method includes following steps. The circuit board is provided, in which the circuit board includes a substrate, at least a metal wire and an insulating layer. The substrate has a chip connecting portion. The metal wire is disposed on the substrate and extending from outside to inside of the chip connecting portion, and the metal wire has a contact pad disposed in the chip connecting portion. The insulating layer is disposed on the metal wire, and the insulating layer has an opening to expose the contact pad. An organic insulating material is formed on the insulating layer of an outside edge of the chip connecting portion. An ACF is formed to cover the chip connecting portion and a portion of the organic insulating material. The semiconductor chip is hot-pressed on the ACF to make a bump of the semiconductor chip electrically connected to the contact pad through the ACF.

In another embodiment, the method includes following steps. The circuit board is provided, in which the circuit board includes a substrate, at least a metal wire and an insulating layer. The substrate has a chip connecting portion. The metal wire is disposed on the substrate and extending from outside to inside of the chip connecting portion, and the metal wire has a contact pad disposed in the chip connecting portion. The insulating layer is disposed on the metal wire, and the insulating layer has an opening to expose the contact pad. A non-conductive film is formed on the chip connecting portion and the insulating layer of an outside edge of the chip connecting portion, in which the non-conductive film is covering a portion of the metal wire. An ACF is formed on the non-conductive film of the chip connecting portion and the insulating layer of the outside edge of the chip connecting portion. The semiconductor chip is hot-pressed on the ACF to make a bump of the semiconductor chip electrically connected to the contact pad through the ACF.

Another aspect of the present invention is to provide a semiconductor chip package structure which includes a substrate, at least a metal wire, an insulating layer, an organic insulating material, an ACF, and a semiconductor chip. The substrate has a chip connecting portion. The metal wire is disposed on the substrate and extending from outside to inside of the chip connecting portion, and the metal wire has a contact pad disposed in the chip connecting portion. The insulating layer is disposed on the metal wire, and the insulating layer has an opening to expose the contact pad. The organic insulating material is disposed on the insulating layer of an outside edge of the chip connecting portion. The ACF is covering the chip connecting portion and a portion of the organic insulating material. The semiconductor chip is disposed on the ACF of the chip connecting portion, in which a bump of the semiconductor chip is electrically connected to the contact pad through the ACF.

BRIEF DESCRIPTION OF THE DRAWINGS

The invention may be more fully understood by reading the following detailed description of the embodiment, with reference made to the accompanying drawings as follows.

DETAILED DESCRIPTION

Figure 1:
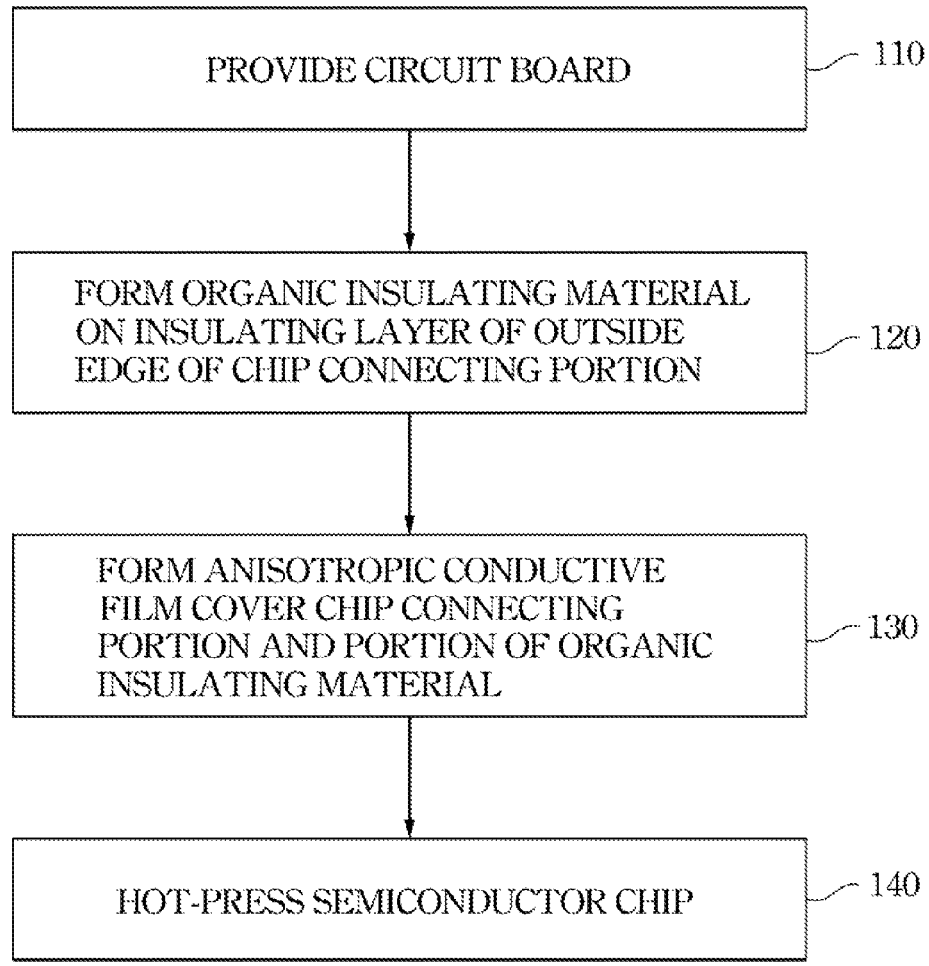
FIG. 1 is a flow chart of a method for fixing a semiconductor chip on a circuit board according to one embodiment of the present invention.
Figure 2A:
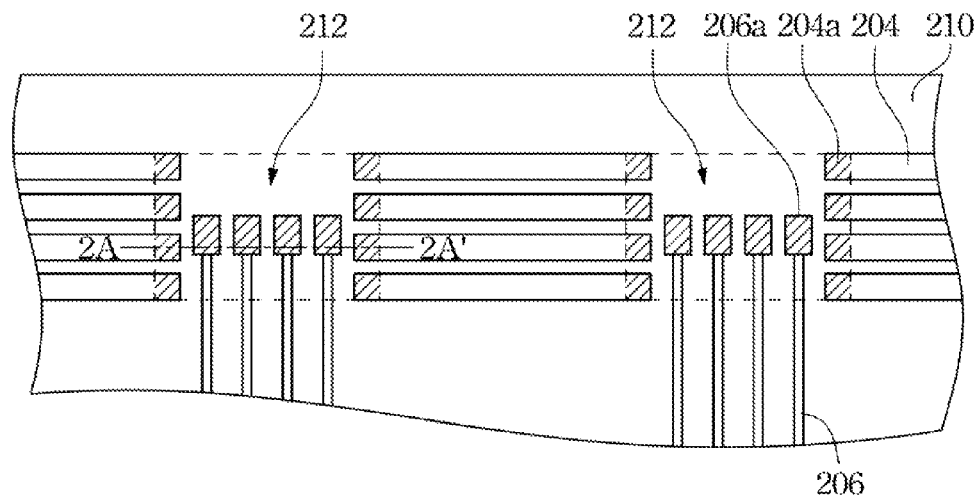
FIG. 2A is a top view schematically illustrating a circuit board according to one embodiment of the present invention.
Figure 2B:
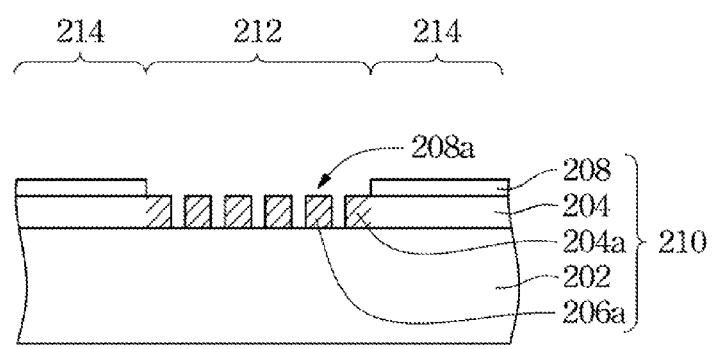
FIG. 2B is a cross-sectional view schematically illustrating a circuit board according to one embodiment of the present invention.
Figure 3A:
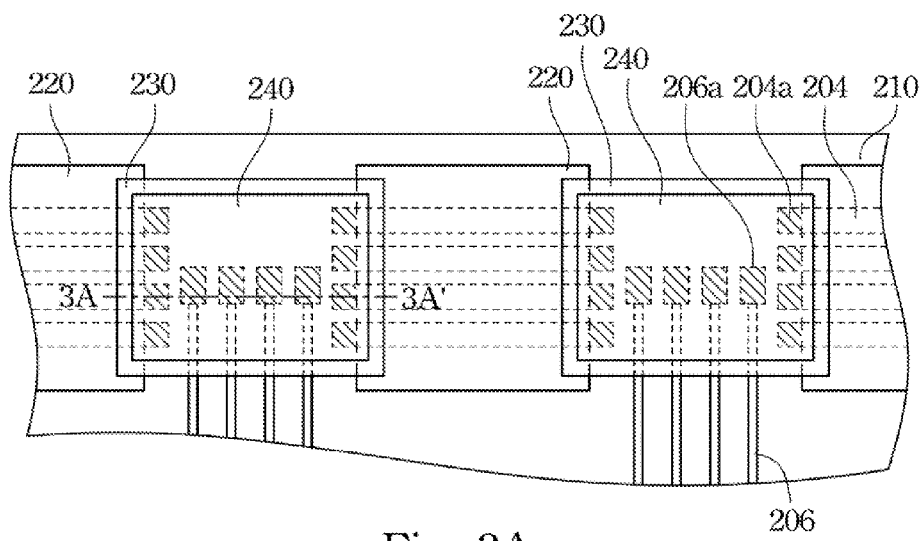
FIG. 3A is a top view schematically illustrating a semiconductor chip package structure according to one embodiment of the present invention.
Figure 3B:
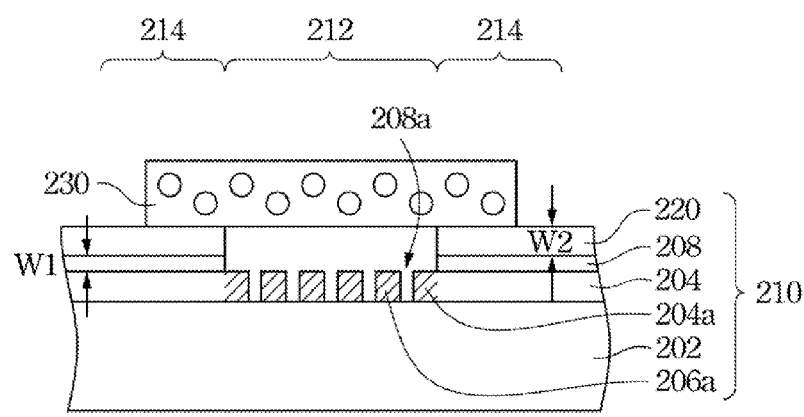
FIGS. 3B and 3C are crass-sectional views schematically illustrating process steps for fixing a semiconductor chip on a circuit board according to one embodiment of the present invention.
Figure 3C:
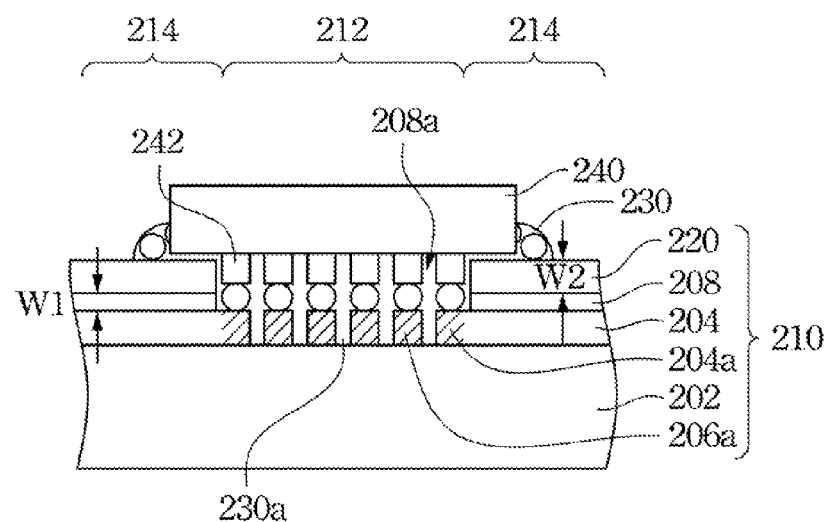

An aspect of the present invention is to provide a method for fixing a semiconductor chip on a circuit board. FIG. 1 is a flow chart of a method 100. FIG. 2A is a top view schematically illustrating a circuit board according to one embodiment of the present invention. FIG. 2B is a cross-sectional view schematically illustrating a circuit board according to one embodiment of the present invention, which is taken along the line 2A-2A' of FIG. 2A. FIG. 3A is a top view schematically illustrating a semiconductor chip package structure according to one embodiment of the present invention. FIGS. 3B and 3C are cross-sectional views schematically illustrating process steps of method 100, which are taken along the line 3A-3A' of FIG. 3A.

In step 110, the circuit board 210 is provided, which includes a substrate 202, metal wires 204, 206 and an insulating layer 208, as shown in FIGS. 2A and 2B. The circuit board 210 may be a portion of a thin film transistor substrate, such as a portion for mounting gate driver chips. The substrate 202 has at least one chip connecting portion 212 and an outside edge 214 of the chip may respectively be an outer metal wire and a metal wire of a terminal portion. The metal wires 204, 206 are extending from outside to inside of the chip connecting portion 212. Also, the metal wires 204, 206 respectively have contact pads 204a, 206a disposed in the chip connecting portion 212. The insulating layer 208 is disposed on the metal wires 204, 206, and it has an opening 208a to expose the contact pads 204a, 206a. In one embodiment, the insulating layer 208 is made of an inorganic material, such as silicon nitride.

In step 120, an organic insulating material 220 is formed on the insulating layer 208 of an outside edge 214 of the chip connecting portion, as depicted in FIGS. 3A and 3B. It is used to isolate an anisotropic conductive film (ACF) and the insulating layer 208 to avoid corrosion of the metal wires after forming the ACF (in step 130) and hot-pressing a semiconductor chip (in step 140). A mechanism of corrosion of metal wires in a conventional structure would be described in step 130. The organic insulating material 220 may be sticky, such as rubber or a non-conductive film (NCF). Alternatively, a surface of the organic insulating material 220 has an adhesive layer (not shown) to adhere the insulating layer 208, such as insulating tape.

In step 130, an ACF 230 is formed to cover the chip connecting portion 212 and a portion of the organic insulating material 220, as shown in FIGS. 3A and 3B. That is, the organic insulating material 220 isolates the ACF 230 and the insulating layer 208 to avoid corrosion of the metal wires. The mechanism of corrosion of metal wires in a conventional structure is inferred hereinafter. When supplying a voltage to the metal wires, those wires and conductive particles of the anisotropic conductive film would form an induced electric which may lead the insulating layer beneath the ACF to rupture. While performing a reliability test under high temperature and high humidity, moisture may penetrate from cracks and then react with the metal wires to cause corrosion. Thus, in the embodiment, the organic insulating material 220 is employed to isolate the ACE 230 and the insulating layer 208 to reduce the induced electric field and further to prevent rupture of the insulating layer 208. In one embodiment, the organic insulating material 220 has a thickness W2 greater than a thickness W1 of the insulating layer 208. Specifically, the thickness W1 of the insulating layer 208 may less than 1 μm, and the thickness W2 of the organic insulating material 220 may be much larger than 1 μm.

In step 140, the semiconductor chip 240 is hot-pressed on the ACF 230 to make a bump 242 electrically connected to the contact pads 204a, 206a through the ACF 230, as depicted in FIGS. 3A and 3C. The semiconductor chip 240 may be used to provide voltage larger than 10 V for the metal wires 204, 206. The semiconductor chip 240 may be a gate driver chip. The ACF 230 flows and fills into the opening 208a during the hot-pressing step. The ACF 230 is isolated from an upper surface of the insulating layer 208 by the organic insulating material 220 to avoid corrosion of the metal wires. In addition, the bumps 242 can be vertically and electrically connected to the contact pads 204a, 206a through deformed conductive particles.

Figure 4:
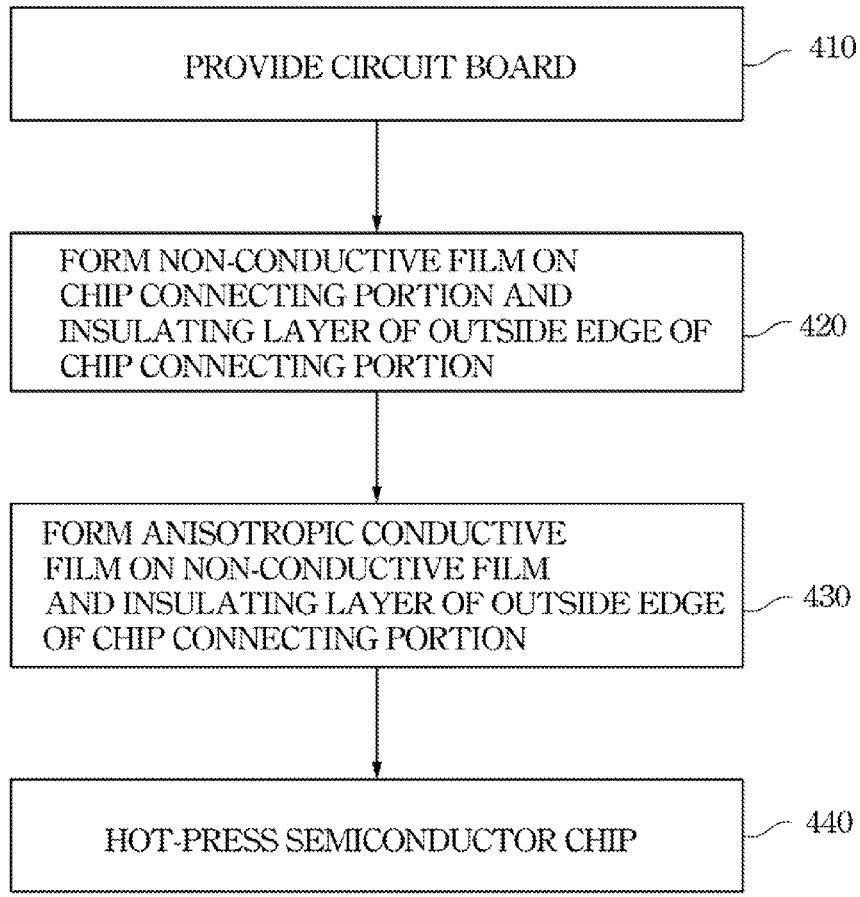
FIG. 4 is a flow chart of a method for fixing a semiconductor chip on a circuit board according to another embodiment of the present invention.
Figure 5A:
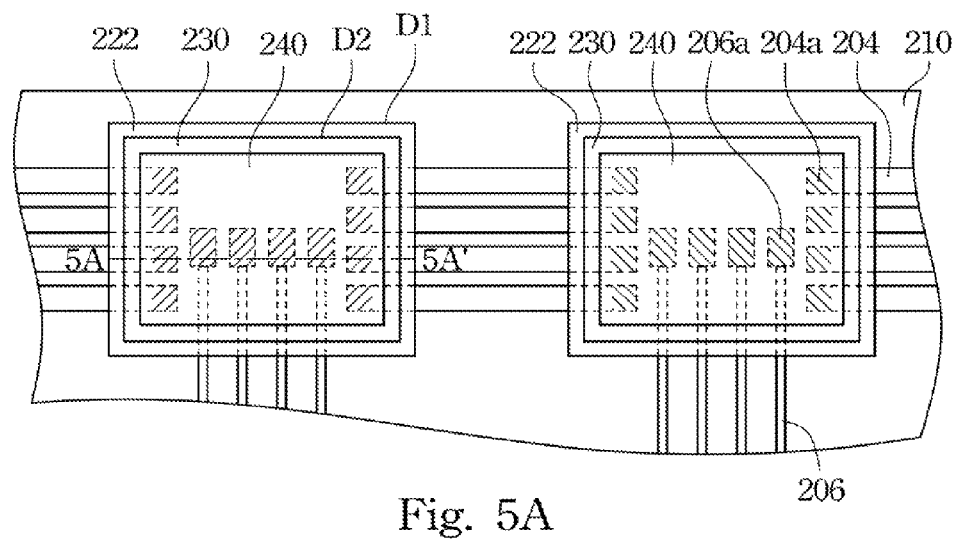
FIG. 5A is a top view schematically illustrating a semiconductor chip package structure according to another embodiment of the present invention.
Figure 5B:
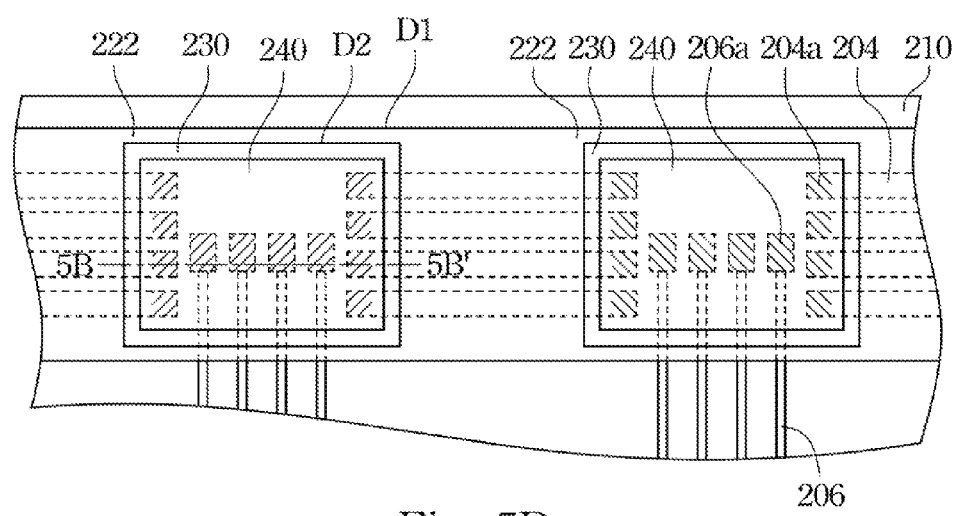
FIG. 5B is a top view schematically illustrating a semiconductor chip package structure according to another embodiment of the present invention.
Figure 5C:
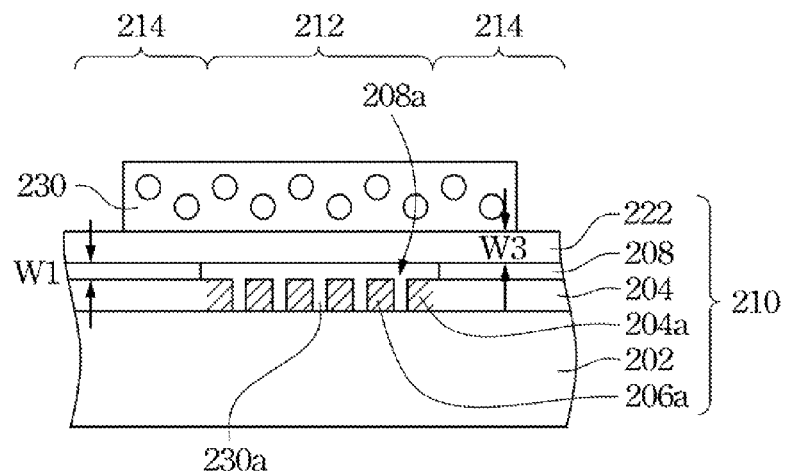
FIGS. 5C and 5D are cross-sectional views schematically illustrating process steps for fixing a semiconductor chip on a circuit board according to another embodiment of the present invention.
Figure 5D:
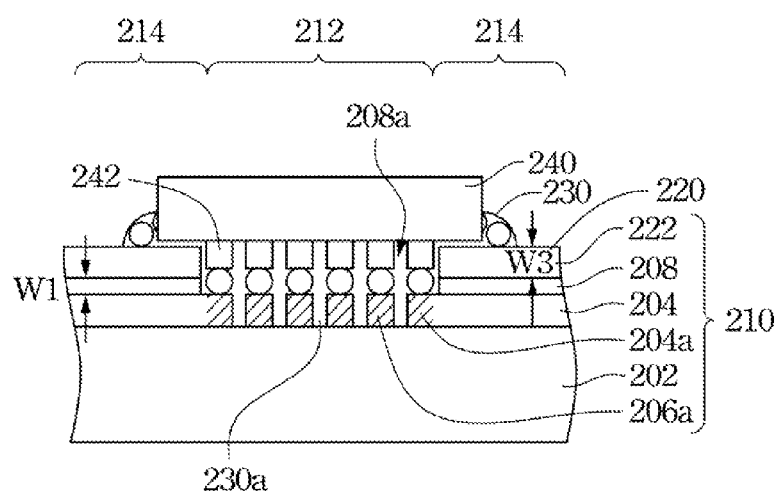

FIG. 4 is a flow chart of a method 400. Step 410 may be the same as step 110 of FIG. 1. There are two embodiments exemplified below. FIG. 5A and FIG. 5B are top views respectively illustrating two semiconductor chip package structures according to the two embodiments. FIGS. 5C and 5D are cross-sectional views schematically illustrating process steps for fixing a semiconductor chip on a circuit board, which is taken along the line 5A-5A' of FIG. 5A or the line 5B-5B' of FIG. 5B.

In step 420, a non-conductive film 222 is formed on the chip connecting portion 212 and the insulating layer 208 of an outside edge 214 of the chip connecting portion, as shown in FIG. 5C. Also, the non-conductive film 222 is covering a portion of the metal wires 204, 206. In one embodiment, the non-conductive film 222 is used to cover one chip connecting portion 212 and the insulating layer 208 of the outside edge 214 of the chip connecting portion, as depicted in FIG. 5k In another embodiment, the non-conductive film 222 is employed to cover a plurality of chip connecting portions 212 and the portions outside thereof, as shown in FIG. 5B.

In step 430, an ACF 230 is formed on the non-conductive film 222 over the chip connecting portion 212, as shown in FIG. 5C. Similar to the organic insulating material 220 of method 100, the non-conductive film 222 is employed to isolate the insulating layer 208 and the ACF 230. In one embodiment, the non-conductive film 222 has a dimension D1 larger than a dimension D2 of the ACF 230, as depicted in FIGS. 5A and 5B. The term "dimension" herein refers to a two-dimension constructed by a length and a width. It is used to prevent an overflow of the ACF 230 from being contacted with an upper surface of the insulating layer 208. In one embodiment, the non-conductive film 222 has a thickness W3 greater than a thickness W1 of the insulating layer 208. The adhesive composition of the ACF 230 is substantially the same as the adhesive composition of the non-conductive film 222, but the non-conductive film 222 does not include any conductive particle.

In step 440, the semiconductor chip 240 is hot-pressed on the ACF 230 to make a bump 242 electrically connected to the contact pads 204a, 206a through the ACF 230, as depicted in FIG. 5D. Both the non-conductive film 222 and the ACF 230 flow and then merge, and thus fill into the opening 208a during the hot-pressing step. In addition, the bumps 242 can be vertically and electrically connected to the contact pads 204a, 206a through deformed conductive particles.

The metal wires do not corrode during a reliability test under high temperature and high humidity in the structures manufactured by two embodiments mentioned above. Therefore, the embodiments disclosed in the present invention can effectively solve the conventional problem of corrosion of metal wires.

Another aspect of the present invention is to provide a semiconductor chip package structure. As shown in FIGS. 3C and 5D, each of the semiconductor chip package structures 300, 500 includes a substrate 202, at least one metal wire 204, an insulating layer 208, an organic insulating material 220, an ACF 230a, and a semiconductor chip 240.

The substrate 202 may be a glass substrate, and has a chip connecting portion 212.

The metal wires 204, 206 disposed on the substrate 202 may respectively be an outer metal wire and a metal wire of a terminal portion. The metal wires 204, 206 are extending from outside to inside of the chip connecting portion 212. Further, the metal wires 204, 206 respectively have contact pads 204a, 206a disposed in the chip connecting portion 212.

The insulating layer 208 is disposed on the metal wires 204, 206, and it has an opening 208a to expose the contact pads 204a, 206a. In one embodiment, the insulating layer 208 is made of an inorganic material, such as silicon nitride.

The organic insulating material 220 is disposed on the insulating layer 208 of an outside edge 214 of the chip connecting portion. In one embodiment, the organic insulating material 220 is rubber, insulating tape or a non-conductive film, as depicted in FIG. 3C. In another embodiment, the organic insulating material 220 is a non-conductive film 222, as depicted in FIG. 5D.

The ACF 230a is covering the chip connecting portion 212 and a portion of the organic insulating material 220. In the semiconductor chip package structure 300, the ACF 230a is formed by hot-pressing the ACF 230. In the semiconductor chip package structure 500, the ACF 230a is formed by hot-pressing the non-conductive film 222 and the ACF 230.

The semiconductor chip 240 is disposed on the ACF 230a of the chip connecting portion 212. A bump 242 is electrically connected to the contact pads 204a, 206a through the ACF 230a.

As mentioned above, an organic insulating material disposed on the insulating layer can prevent the metal wires beneath the insulating layer from corrosion. Furthermore, it can reduce amount of scrapped panels and scrap costs.

It will be apparent to those ordinarily skilled in the art that various modifications and variations may be made to the structure of the present invention without departing from the scope or spirit of the invention. In view of the foregoing, it is intended that the present invention cover modifications and variations thereof provided they fall within the scope of the following claims.

What is claimed is:

1. A semiconductor chip package structure, comprising:
   a substrate having a chip connecting portion;
   at least one metal wire disposed on the substrate and extending from an outside of the chip connecting portion to an inside of the chip connecting portion, and the metal wire having a contact pad disposed in the chip connecting portion;
   an insulating layer disposed on the metal wire, and the insulating layer having an opening to expose the contact pad;
   an organic insulating material disposed on the insulating layer of an outside edge of the chip connecting portion;
   an anisotropic conductive film (ACF) covering the chip connecting portion and a portion of the organic insulating material; and is a semiconductor chip disposed on the ACF of the chip connecting portion, wherein a bump of the semiconductor chip is electrically connected to the contact pad through the ACF.

2. The semiconductor chip package structure of claim 1, wherein the organic insulating material has a thickness greater than a thickness of the insulating layer.

3. The semiconductor chip package structure of claim 1, wherein the insulating layer comprises an inorganic material.

4. The semiconductor chip package structure of claim 1, wherein the organic insulating material is rubber, insulating tape or a non-conductive film.

* * * * *